(12) United States Patent
Inoue et al.

(10) Patent No.: US 8,030,692 B2
(45) Date of Patent: Oct. 4, 2011

(54) SOLID STATE IMAGE SENSING DEVICE

(75) Inventors: Tadao Inoue, Kawasaki (JP); Hiroshi Daiku, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/130,280

(22) Filed: May 30, 2008

(65) Prior Publication Data
US 2008/0296643 A1 Dec. 4, 2008

(30) Foreign Application Priority Data

May 31, 2007 (JP) ................................ 2007-145170

(51) Int. Cl.
*H01L 31/062* (2006.01)
(52) U.S. Cl. ........ 257/292; 257/294; 257/432; 257/435; 257/232; 257/233; 257/223; 257/258
(58) Field of Classification Search .................. 257/292, 257/232, 294, 435, 233, 223, 258
See application file for complete search history.

(56) References Cited

U.S. PATENT DOCUMENTS

| 5,661,608 | A | * | 8/1997 | Barbier et al. | 359/800 |
| 6,970,293 | B2 | * | 11/2005 | Natori | 359/626 |
| 2007/0222885 | A1 | * | 9/2007 | Katsuno et al. | 348/340 |

FOREIGN PATENT DOCUMENTS

| JP | 2001-160973 | | 6/2001 |
| JP | 2001-298177 | * | 10/2001 |
| JP | 2004-296590 | | 10/2004 |

OTHER PUBLICATIONS

Machine translation of JP2001-298177 has been attached.*

* cited by examiner

*Primary Examiner* — Wai Sing Louie
*Assistant Examiner* — Bilkis Jahan
(74) *Attorney, Agent, or Firm* — Fujitsu Patent Center

(57) ABSTRACT

A solid state image sensing device in which many pixels are disposed in a matrix on a two-dimensional plane comprises a plurality of light receiving devices disposed in such a way that a center interval may periodically change in a column direction and/or a row direction, and a plurality of micro-lenses, for collecting an incident light of each light receiving device, wherein a center interval periodically changes in accordance with the periodic change of the center interval of the light receiving device.

18 Claims, 22 Drawing Sheets

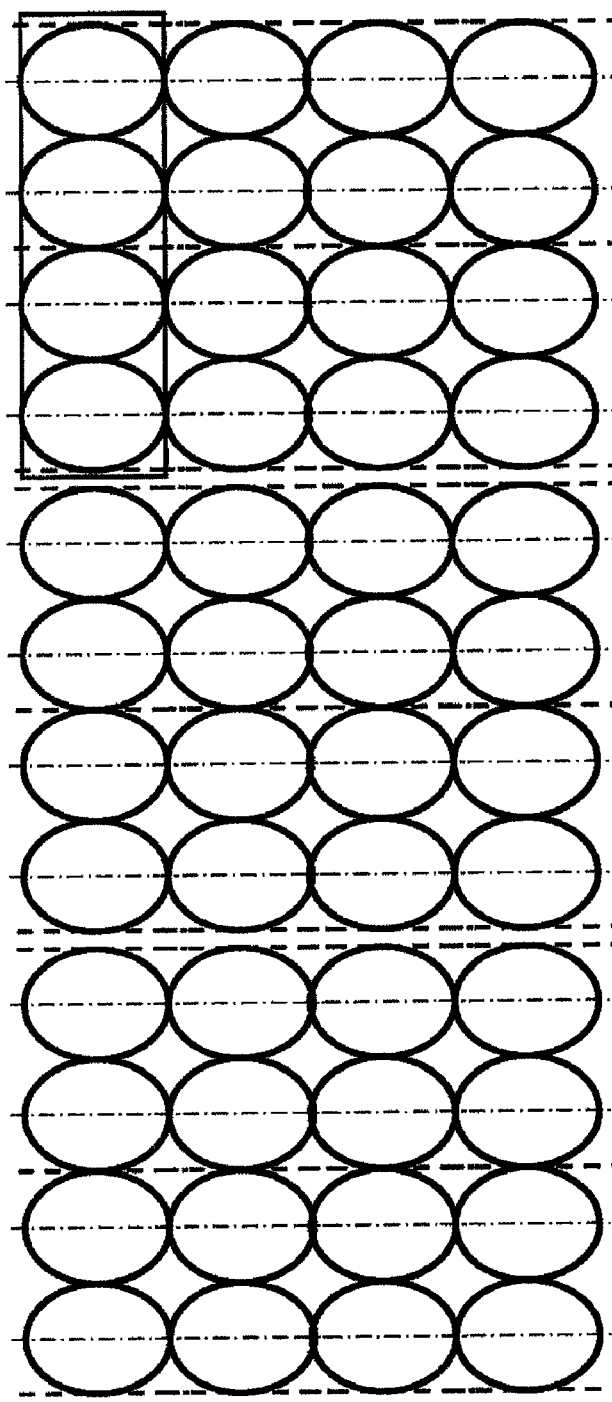
F I G. 7

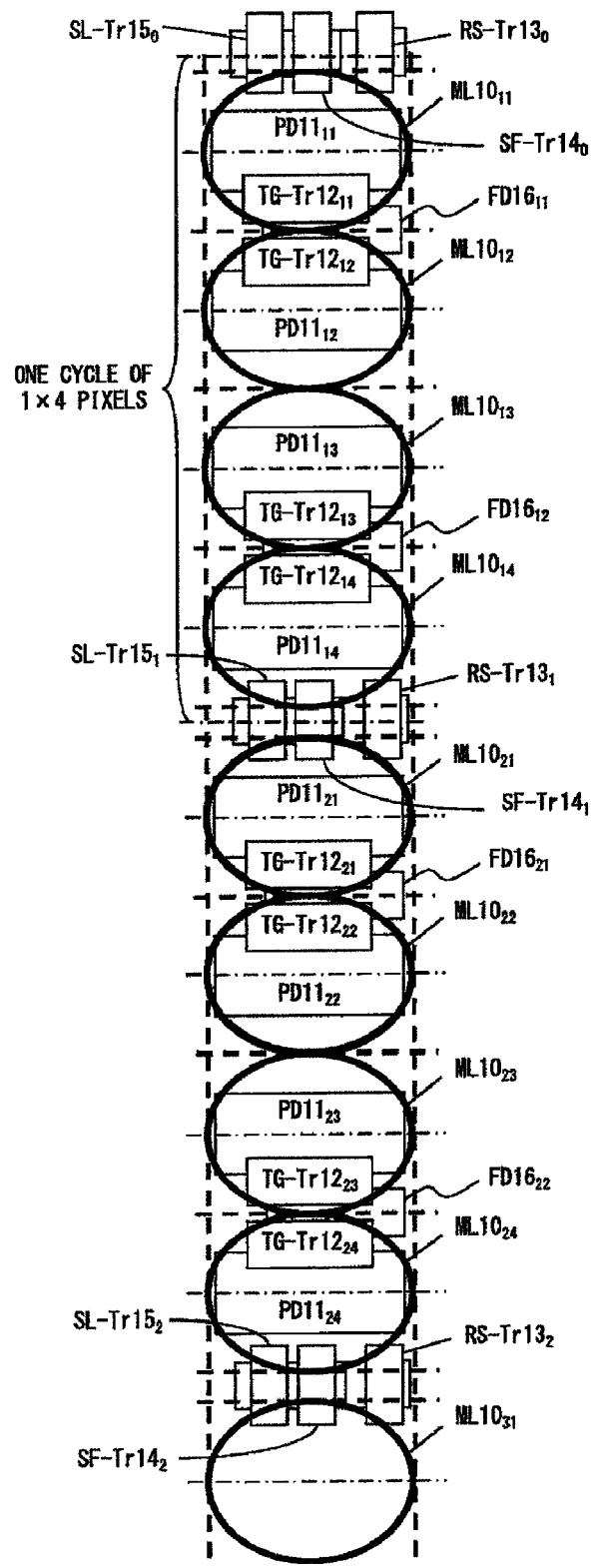
F I G. 8

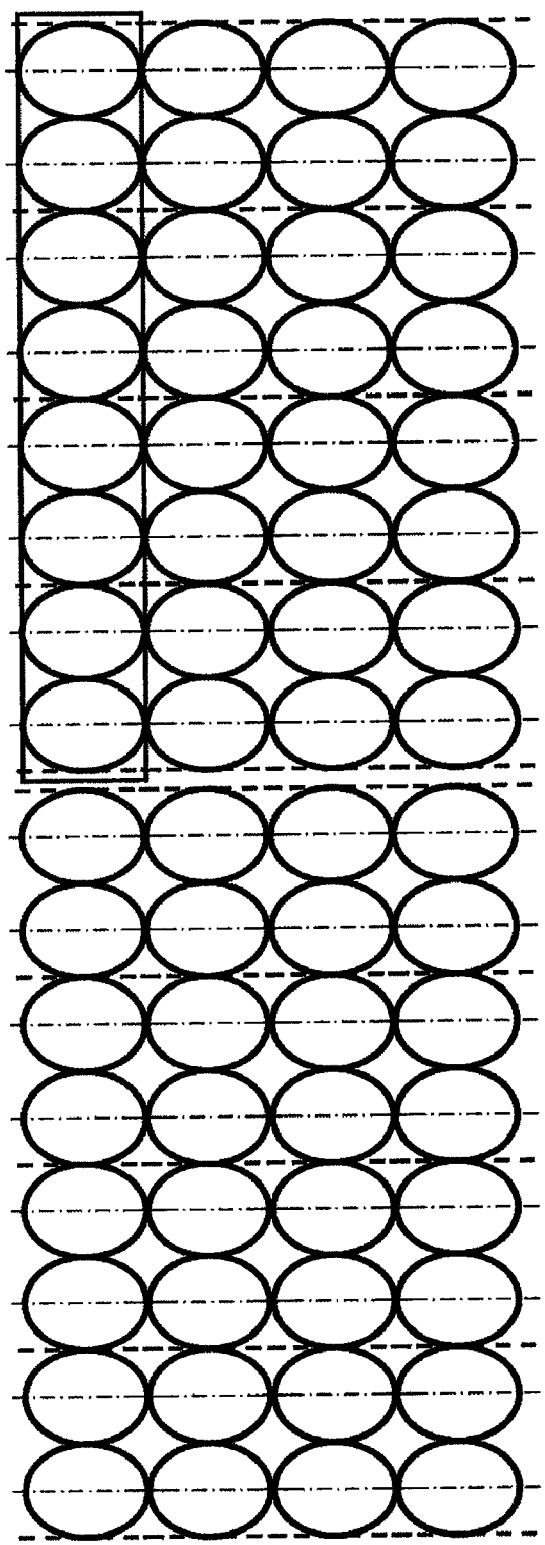
F I G. 9

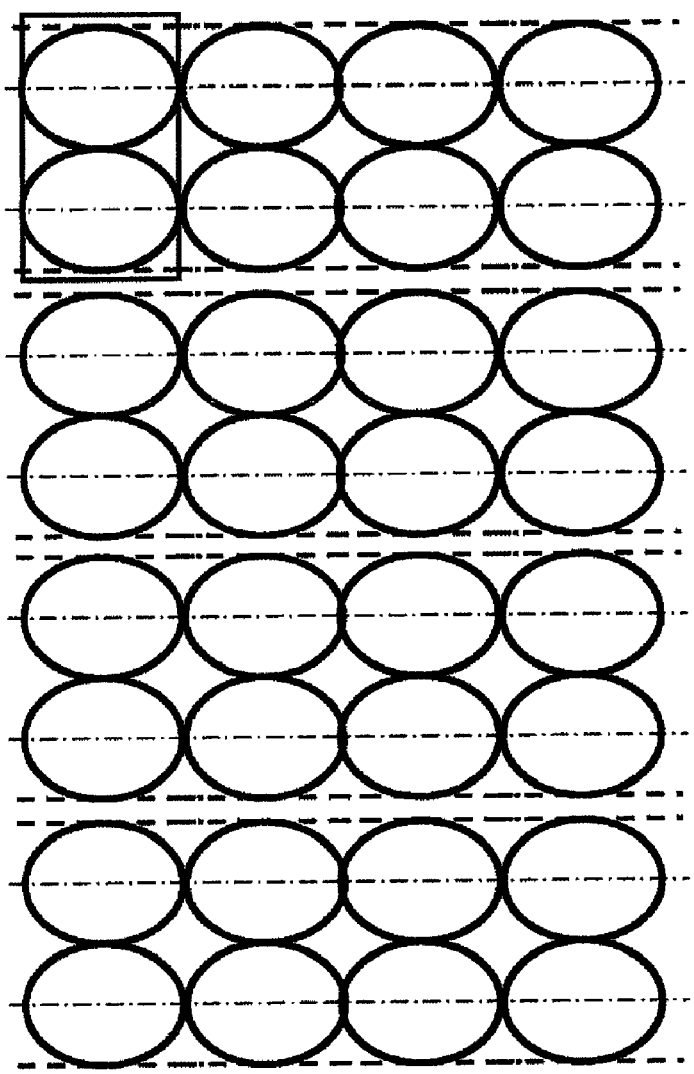
F I G. 1 1

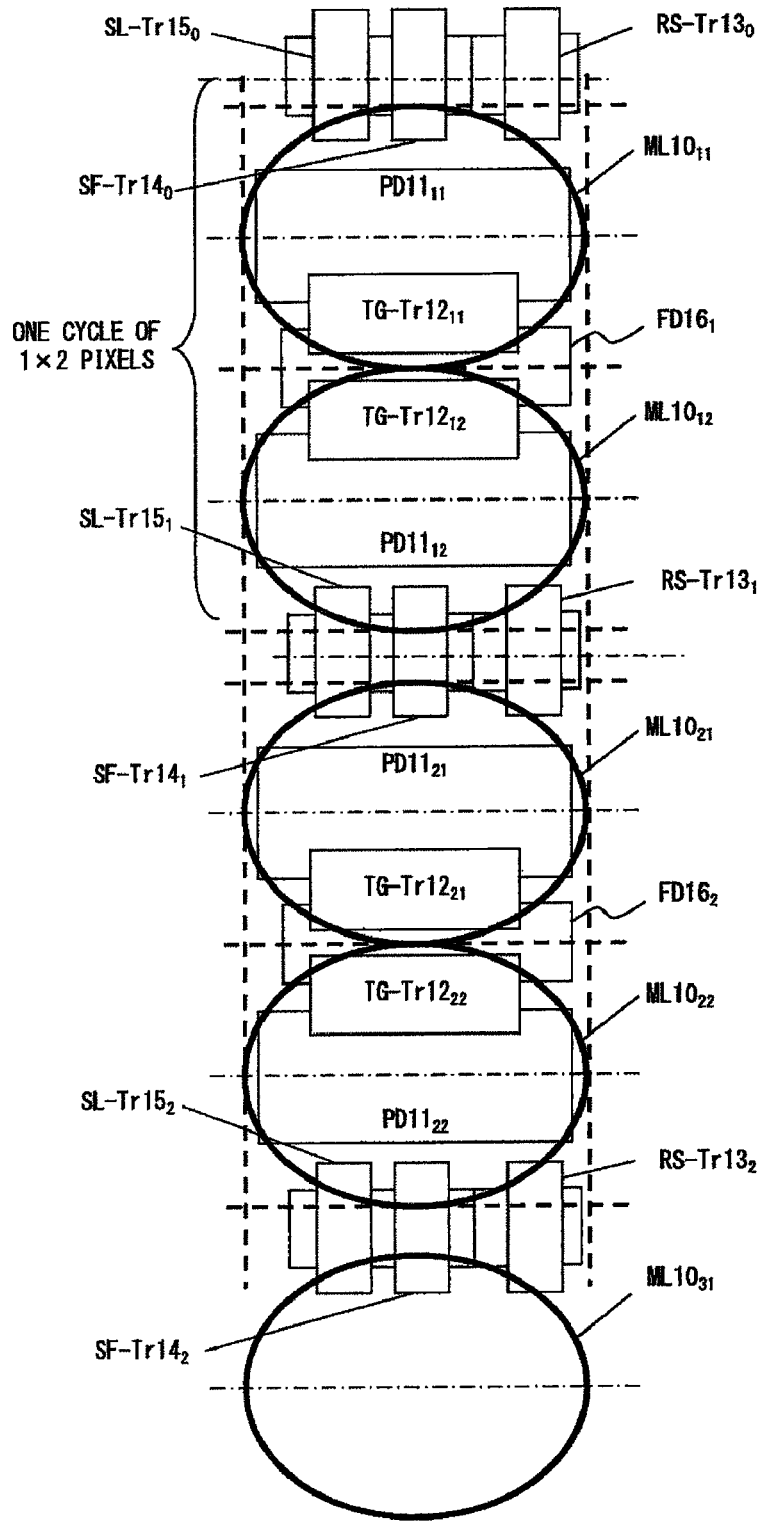
F I G. 1 2

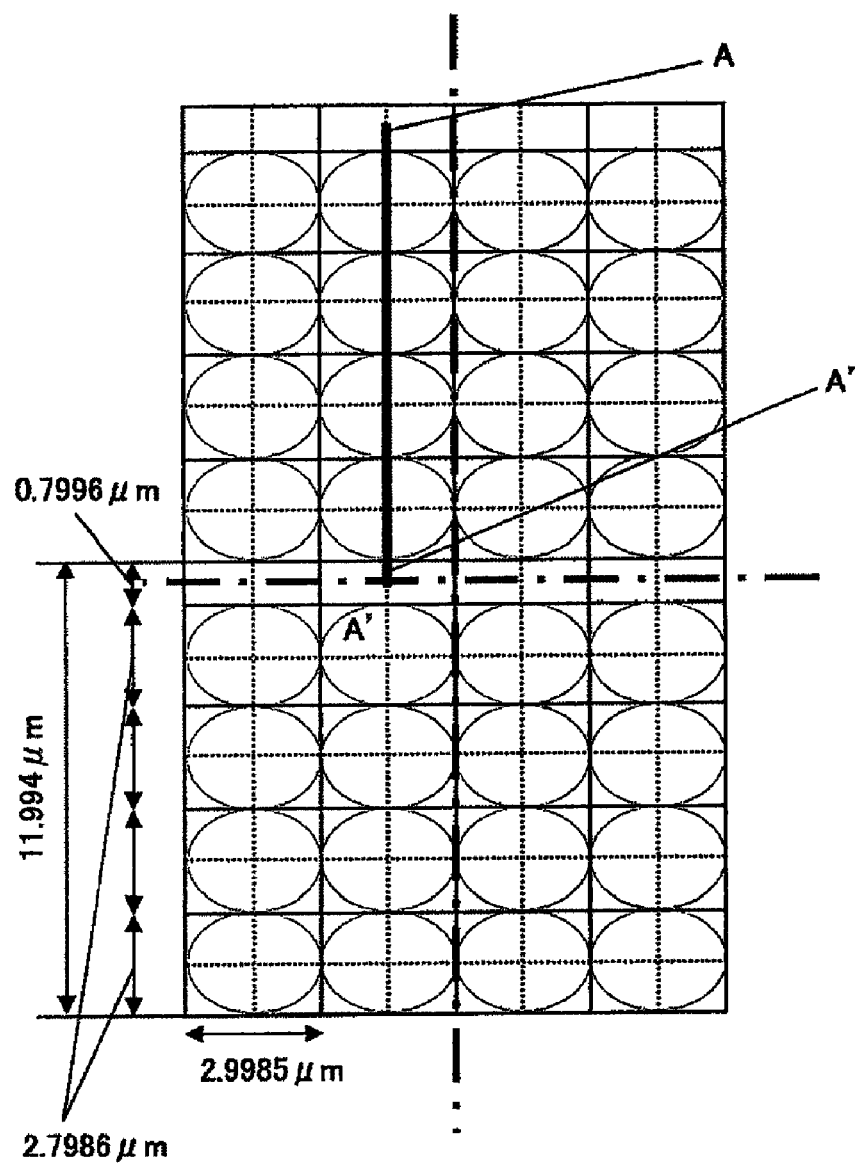
F I G. 18

SOLID STATE IMAGE SENSING DEVICE

CROSS REFERENCE TO RELATED APPLICATIONS

This application is based upon and claims the benefit of priority from the prior Japanese Patent Application No. 2007-145170 filed on May 31, 2007, the entire contents of which are incorporated herein by reference.

BACKGROUND

1. Field

The embodiments discussed herein are directed to a solid state image sensing device, for example a CMOS image sensor, on which a plurality of pixels are disposed in a matrix, which may relate to a solid state image sensing device using a shared type pixel in which a part of a transistor or the like for pixel data read is shared by a plurality of pixels.

2. Description of Related Art

A video camera or a digital camera uses a CCD or CMOS solid state image sensing device. In such a solid state image sensing device, a plurality of pixels each having, for example, a photo diode are disposed in a matrix as a light receiving unit and an incident light into each pixel is converted to electron by the photo diode to generate charge signal. The generated charge signal is outputted to the outside via a signal line.

FIG. 1 shows a pixel disposed in such a matrix and a prior art read circuit for reading the data of the pixel. FIG. 1 shows an example of the CMOS image sensor, which is an active photo sensor (APS) comprises a photo diode corresponding to the pixel and four transistors for pixel data read.

In FIG. 1 light received by a photo diode (PD) 101 is converted to electron and transferred to a floating diffusion layer (FD) by a transfer gate transistor (TG-Tr) 102. The FD converts charge signal transferred from PD 101 to a voltage. The voltage is inputted to a source follower transistor (SF-Tr) 103 and a drive capability is amplified. Then, the voltage is outputted to the outside via a select transistor (SL-Tr) 104 for selecting a row. A voltage of the FD can be reset by a reset transistor (RS-Tr) 105.

As shown in FIG. 1, in an APS, which comprised four transistors for data read that are provided for a photo diode, a shared type pixel, in which at least a part of a transistor or the like for data read is shared by a plurality of pixel for the purposes of miniaturization of device, scaling down and a low cost, is became to used. FIG. 2 shows a prior art transistor sharing method in such a shared type pixel. In FIG. 2 although a transfer gate transistor TG-Tr is provided for each of four photo diodes (PD1~PD4), respectively, the other three transistors of a reset transistor, a source follower transistor and a select transistor are shared.

Such shared type pixel as shown in FIG. 2 is formed, for example, by disposing a photo diode layer and transistors on a silicon substrate, in such a shared type pixel is it difficult to dispose them on the substrate at perfectly equal intervals (center pitch) between pixels, especially photo diodes as a light receiving unit compared with the case where all the transistors for data read are provided for each pixel. Although the circuit shown in FIG. 2 corresponds to FIG. 4 of Patent Document 1 as the prior art of a solid state image sensing device, in FIG. 4 too it is clear that intervals between light receiving areas are not perfectly the same, intervals between at least some light receiving areas are shorter.

In order to improve a light receiving efficiency of a light receiving device corresponding to each pixel in an image sensor, generally an on-chip micro-lens (hereinafter omitted as "micro-lens") is provided on the surface of a photo diode. Generally all the intervals (center pitches) between micro-lenses are the same like the case where all of the transistor for data read are provided for each pixel.

In the case when all the intervals between micro-lenses are the same, and intervals between light receiving devices, for example photo diodes corresponding to pixels are not the same, there is a problem that a light receiving sensitivity differs by pixels in which, for example a deviation occurs between the center position of the light receiving area of the photo diode and the center position of the micro-lens.

For example, if three transistors are disposed between the disposition area of PD2 and that of PD3 as in the circuit shown in FIG. 2, there is a problem in which periodic stripes occur on the screen due to the difference in sensitivity between pixels since these three disposition areas are connected in a traverse direction, i.e., a horizontal direction.

Patent Document 2 as the prior art of such a solid state image sensing device and the like discloses a technology for reducing the amount of shading by deviating the center positions of a micro-lens and a color filter away from the center position of a light receiving unit in the circumference of the screen in order to prevent color shading caused by the oblique direction of an incident light in the circumference of the screen, specifically the color imbalance of RGB between the center and the circumference in a solid state image sensing device provided with a color filter between the micro-lens and the light receiving unit.

The similar Patent Document 3 discloses the forming method of a micro-lens in which there is design constraint and less forming difficulty and in which the amount of light received by a light receiving device in the circumference can be effectively prevented from decreasing.

However, the problem that the center position of the photo diode as a light receiving unit deviates away from that of the micro-lens the intervals between which are almost perfectly uniform in an image sensor using a shared type pixel in which the intervals between micro-lenses are not perfectly uniform and quality as the output of the image sensor deteriorates cannot be solved.

Patent Document 1: Japanese Patent Application Publication No. 2001-298177, "Solid State Image Sensing Device and Image Sensing System"

Patent Document 2: Japanese Patent Application Publication No. 2001-160973, "Solid State Image Sensing Device and Electronic Camera"

Patent Document 3: Japanese Patent Application Publication No. 2004-296590, "Micro-lens Forming Method in Image Sensing Device"

SUMMARY

It is an aspect of the embodiments discussed herein to provide a solid state image sensing device in which many pixels are disposed in a matrix on a two-dimensional plane and transistors are shared to read pixel data from a light receiving device in each of a plurality of pixels, including: a plurality of light receiving devices disposed in such a way that a center interval may periodically change in a column direction and/or in a row direction; and a plurality of micro-lenses which is used to collect incident light of each of the plurality of light receiving devices and a center interval of which periodically changes in accordance with a periodic change of the center interval of the light receiving device.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 7 explains the disposition method of micro-lens in the second preferred embodiment.

FIG. 8 explains the disposition of photo diodes and each transistor in the second preferred embodiment.

FIG. 9 explains the disposition method of micro-lens in the third preferred embodiment.

FIG. 11 explains the disposition method of micro-lens in the fourth preferred embodiment.

FIG. 12 explains the disposition of photo diodes and each transistor in the fourth preferred embodiment.

FIG. 18 explains the dimensions of a micro-lens disposition area of on a pixel plane.

DESCRIPTION OF THE PREFERRED EMBODIMENTS

Figure 1:
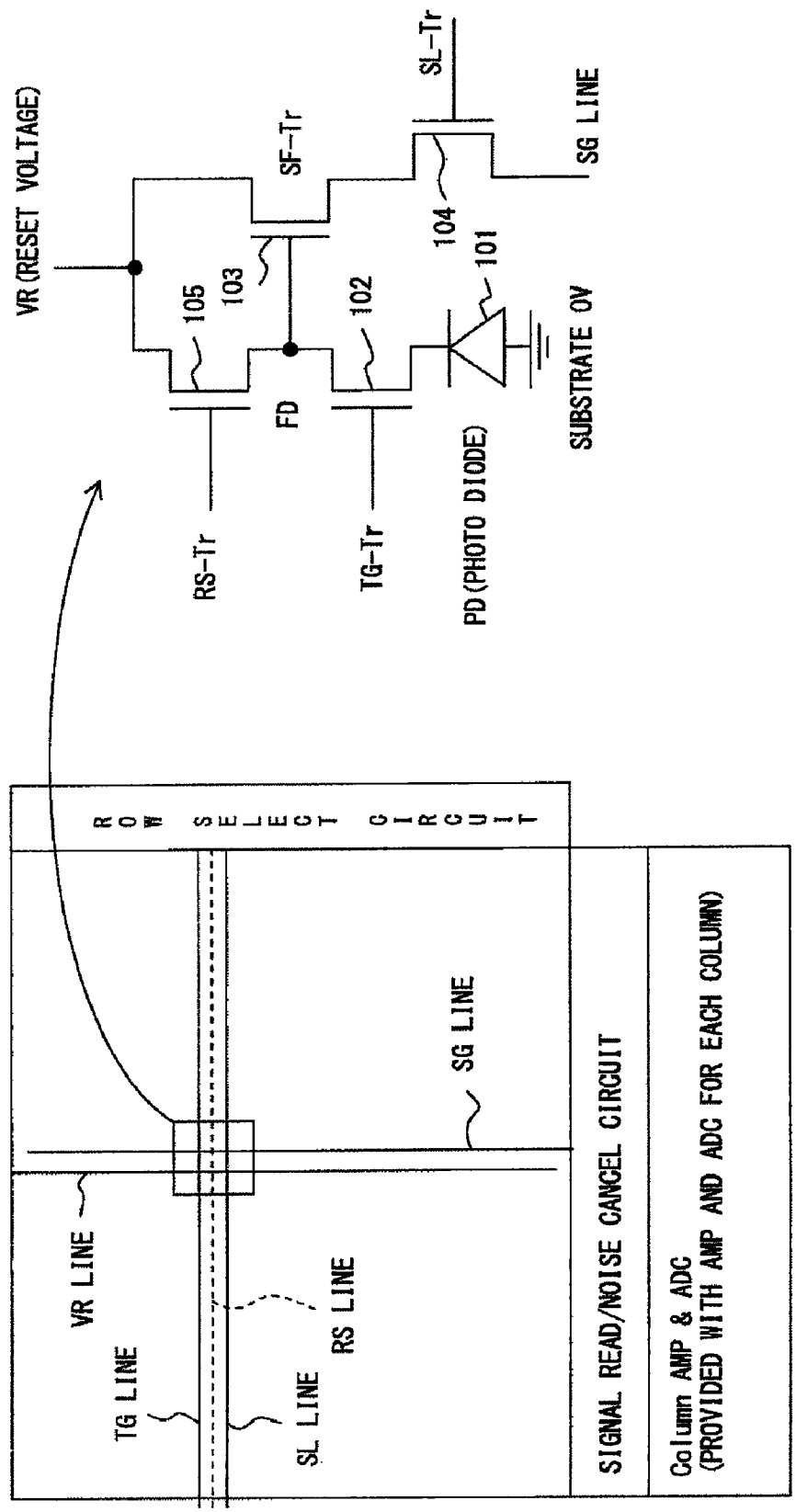
FIG. 1 is a pixel data read circuit in a CMOS image sensor of prior art.
Figure 2:
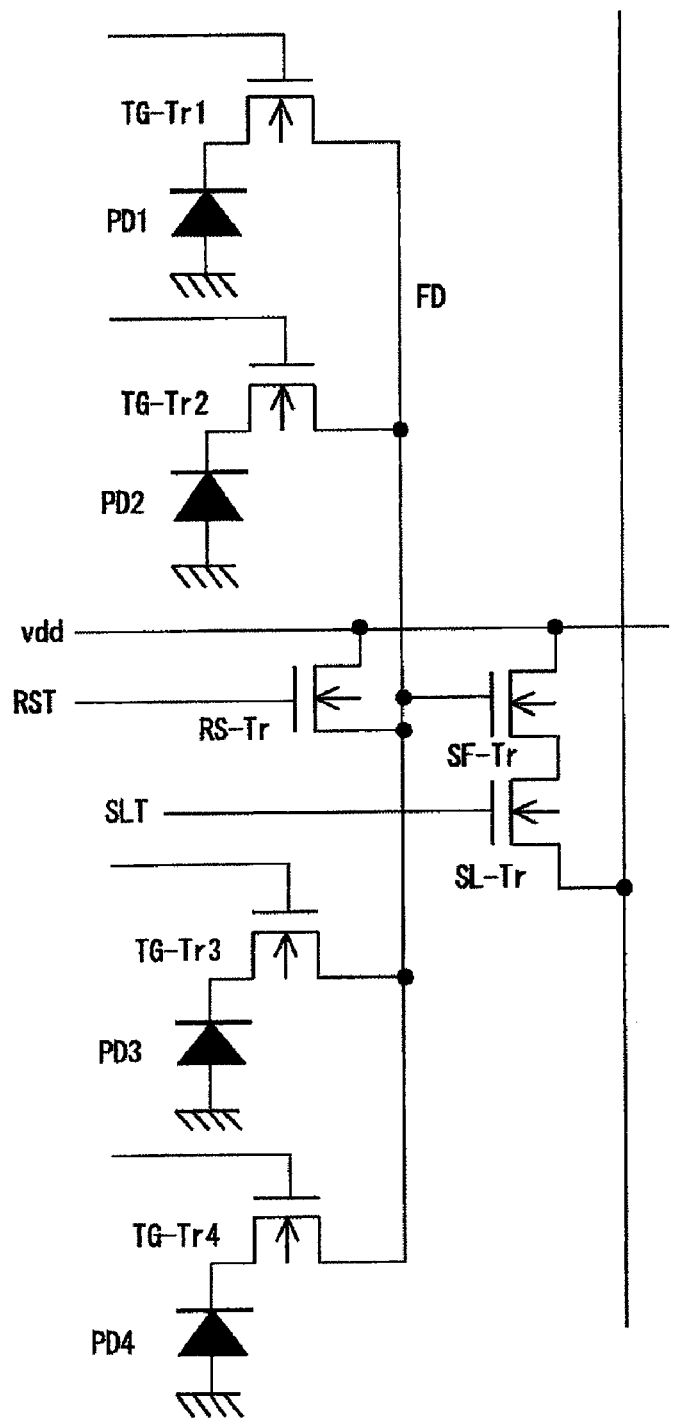
FIG. 2 is a circuit diagram of a shared type pixel which shared a part of transistors for pixel data read in a plurality of pixels of prior art.
Figure 3:
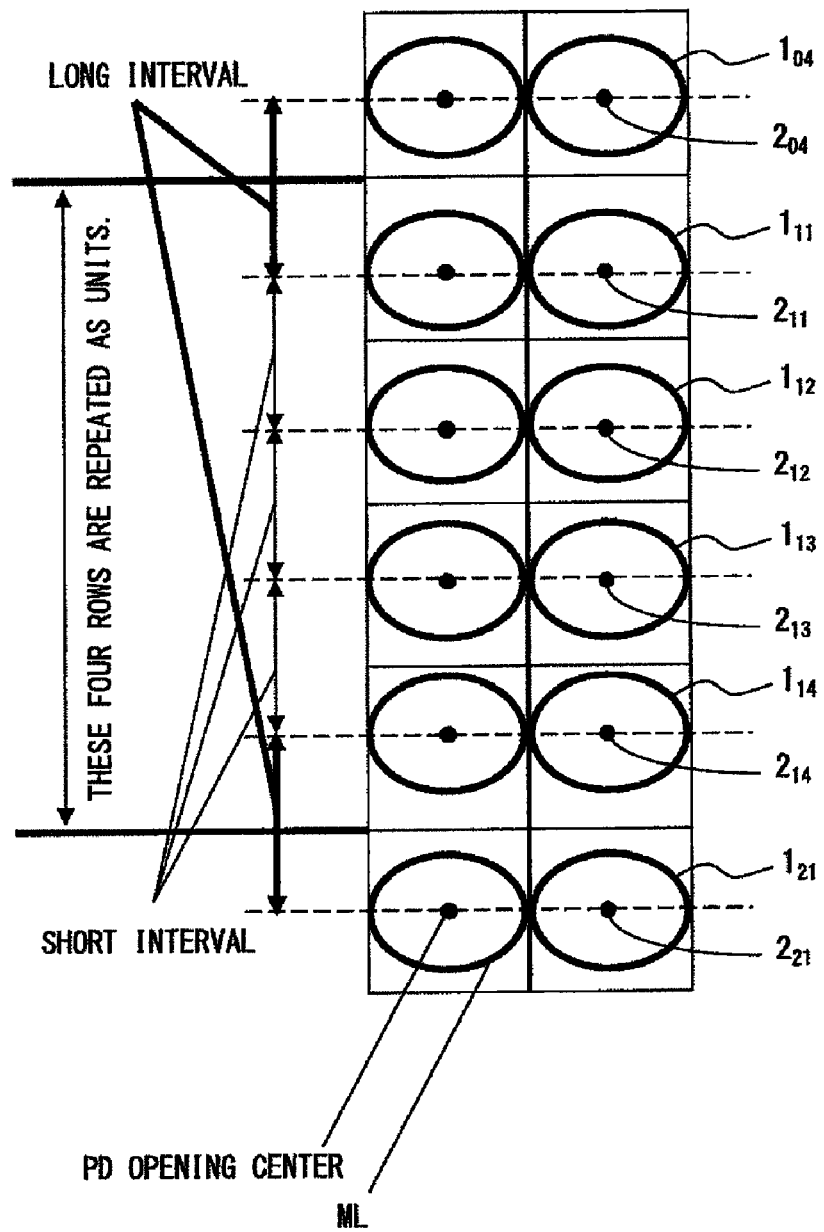
FIG. 3 theoretically explains the periodic change of the center pitch of a photo diode and a micro-lens.

FIG. 3 theoretically explains the disposition method of micro-lenses inside the solid state image sensing device of this preferred embodiment. In the former half of the description, it is targeted on the shared type pixel sharing transistors needed to read pixel data and the like by a plurality of pixels, and it is based on the matching and disposing of the photo diode in each pixel with the center position of a micro-lens, for example the center position of a micro-lens provided in one-to-one relation with each light receiving device.

FIG. 3 is a theoretical example. In this example, on a pixel plane on which a plurality of pixels are disposed in columns and rows, for every four pixels continued in each row direction as a unit, photo diodes and micro-lenses are disposed in such a way as to periodically change each center pitch of a photo diode and a micro-lens.

In FIG. 3, micro-lenses of four micro-lenses $1_{11}$~$1_{14}$ in each row direction correspond to four transistor shared pixels, and mutual intervals between the centers ($2_{11}$~$2_{14}$) of these four micro-lenses are comparatively short, however, for example, the intervals between the centers $2_{04}$ and $2_{11}$ of micro-lens $1_{04}$ and $1_{11}$, respectively, in such a way as to share transistors with pixels corresponding to three upper micro-lenses, which are not shown in FIG. 3, are comparatively long.

That is, in FIG. 3 the center pitch of a micro-lens periodically changes by the number (No.) of consecutive micro-lenses every four consecutive pixels as a unit in each row on a pixel plane. Thus, even when the center pitch of a photo diode changes due to the sharing of transistors, the sensitivity can be uniform between pixels by changing the center pitch of a micro-lens in accordance with the change.

Figure 4:
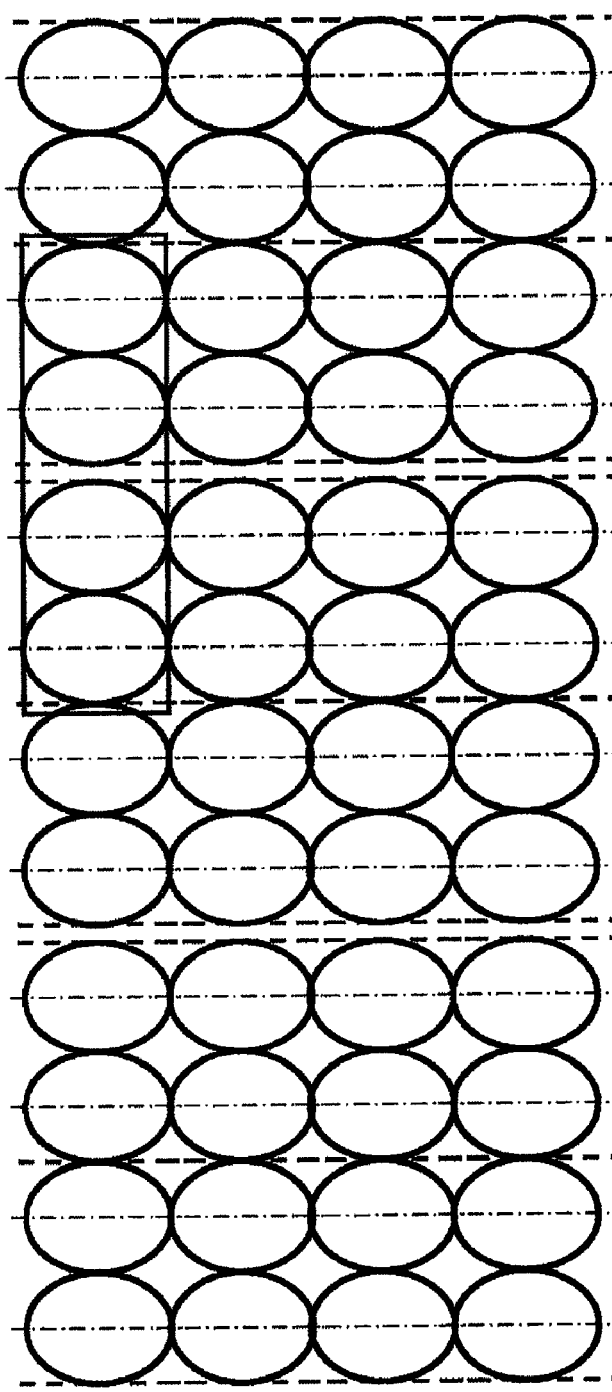
FIG. 4 explains the disposition method of micro-lens in the first preferred embodiment.
Figure 5:
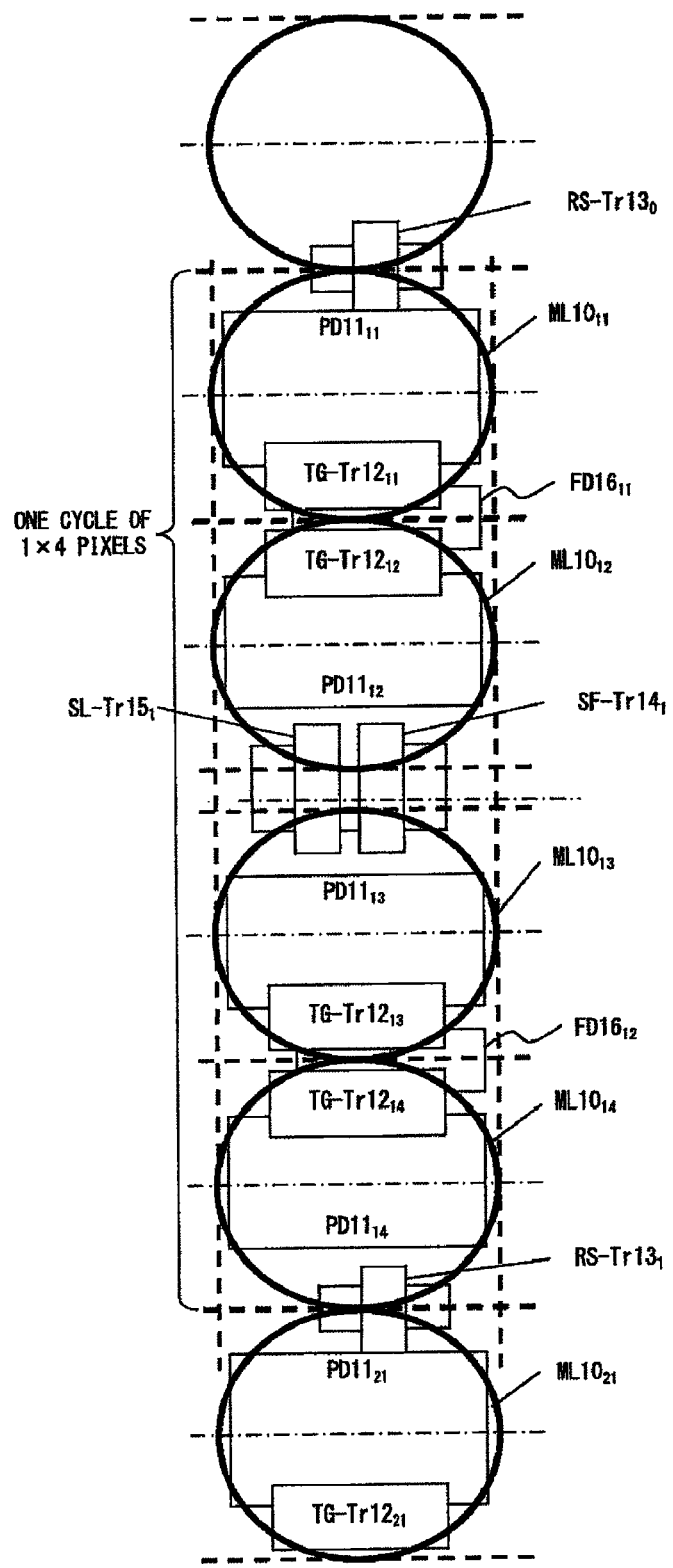
FIG. 5 explains the disposition of photo diodes and each transistor in the first preferred embodiment.
Figure 6:
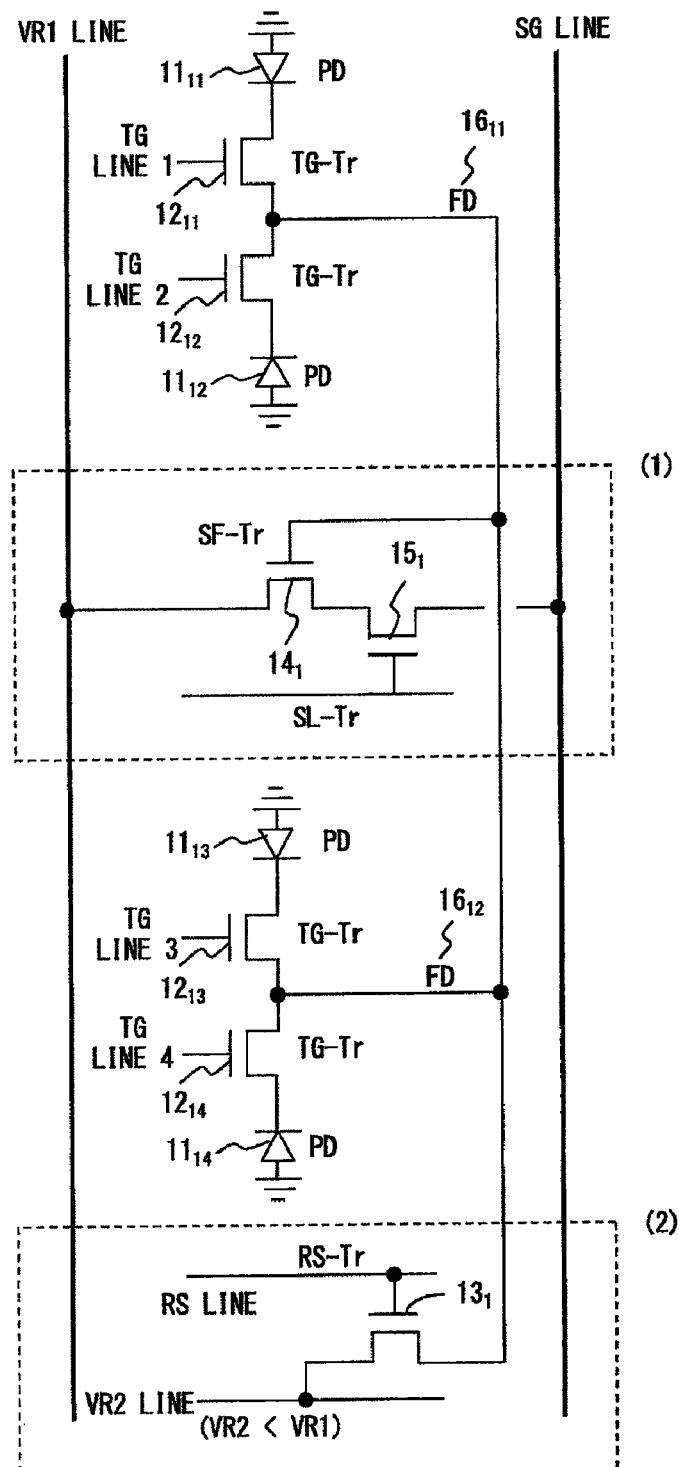
FIG. 6 is the circuit diagram of a photo diode and a data read circuit corresponding to the disposition shown in FIG. 5.

Some detailed examples of the micro-lens disposition method in this preferred embodiment are described below as the preferred embodiments. FIGS. 4~6 explain the first preferred embodiment. FIG. 4 explains the micro-lens disposition method in the first preferred embodiment. In FIG. 4, as shown by a solid rectangle, micro-lenses are disposed in such a way that the center pitch of a micro-lens changes every four consecutive pixels as a unit on a pixel plane, as in the theoretic disposition shown in FIG. 3.

FIG. 5 explains the disposition of micro-lenses, photodiodes and transistors for pixel data read every four pixels as a unit. FIG. 6 is the connection circuit diagram of photo diodes and transistors, corresponding to the disposition. The relationship with the disposition of micro-lenses shown in FIG. 4 is described with reference to FIGS. 5 and 6. In FIG. 6, although the power supply voltage VR1 and reset voltage VFR2, corresponding SF-Tr $14_1$ are different, theoretically VR1 and VR2 can be also the same.

In FIG. 5, two transfer gate transistors (TG-Tr) $12_{11}$ and $12_{12}$ which transfers charge signals from respective PD are disposed between a photo diode (PD) $11_{11}$ corresponding to a micro-lens (ML) $10_{11}$ and a PD$11_{12}$ corresponding to a ML$10_{12}$ and a floating diffusion layer (FD) $16_{11}$ that the charges are transferred is also disposed.

Then, a source follower transistor (SF-Tr) $14_1$ for drive capability amplification and a transistor (SL-Tr) $15_1$ for row selection are disposed between PD$11_{12}$ corresponding to an ML$10_{12}$ and a PD$11_{13}$ corresponding to an ML$10_{13}$. In FIG. 6, this area corresponds to the wiring line (1). In FIG. 5, although as to the transistor for row selection only SL-Tr$15_1$ is provided for four pixels, a TG-Tr is disposed for each pixel. By simultaneously turning on the TG-Tr and the SL-Tr at the time of resetting the PD or by turning on only the TG-Tr when transferring a charge signal from the PD to the FD at the time of reading, one row can be correctly selected from the four rows.

Two TG-Tr$12_{13}$ and $12_{14}$ and a FD $16_{12}$ are disposed between a PD$11_{13}$ corresponding to an ML$10_{13}$ and a PD$11_{14}$ corresponding to an ML$10_{14}$ as between the PD$11_{11}$ and $11_{12}$.

Furthermore, a reset transistor (RS-Tr) $13_1$ is disposed between a PD $11_{14}$ corresponding to an ML$10_{14}$ and a PD$11_{21}$ corresponding to the ML$10_{21}$ of a part of the next unit of four pixels. In FIG. 6, this area corresponds to wiring line (2). In this way, in the first preferred embodiment, micro-lenses are disposed in such a way that the mutual interval between the second and third micro-lenses in four micro-lenses corresponding to four pixels forms an unit of one period may become longer than that between the other micro-lenses. This first preferred embodiment corresponds to the disposing of photo diodes and micro-lenses claimed in Claim 8 of this application.

FIGS. 7 and 8 explain the second preferred embodiment. In the second preferred embodiment, as in the first preferred embodiment, the center pitch, that is, interval of a micro-lens periodically also changes every four micro-lenses as one unit, however the disposition of transistors shared by four pixels is partially different. In FIG. 7, just as in FIG. 3, the center pitch, that is, interval between the four consecutive micro-lenses in each row is comparatively short, however an interval between micro-lenses corresponding to both last and top ends of the consecutive four consecutive pixels as a unit is comparatively long.

In FIG. 8, although the disposition of a transfer gate transistor TG-Tr and a floating diffusion layer (FD) is the same as that of the first preferred embodiment, a reset transistor, for example, $13_1$, a source follower transistor $14_1$ and a select transistor $15_1$ are disposed between an area of the present four consecutive pixels and the next four consecutive pixels, for example, between an area of the $PD11_{14}$ corresponding to the $ML10_{14}$ and the $PD11_{21}$ corresponding to the $ML10_{21}$. Thus, only the interval between these ML is longer than that between the other ML.

Although the disposition of the second preferred embodiment corresponds to that of claim 9 in this specification, in claim 9, for example, four pixels corresponding to photo diodes $11_{11}$~$11_{22}$ are the four pixels which form one period.

Figure 10:
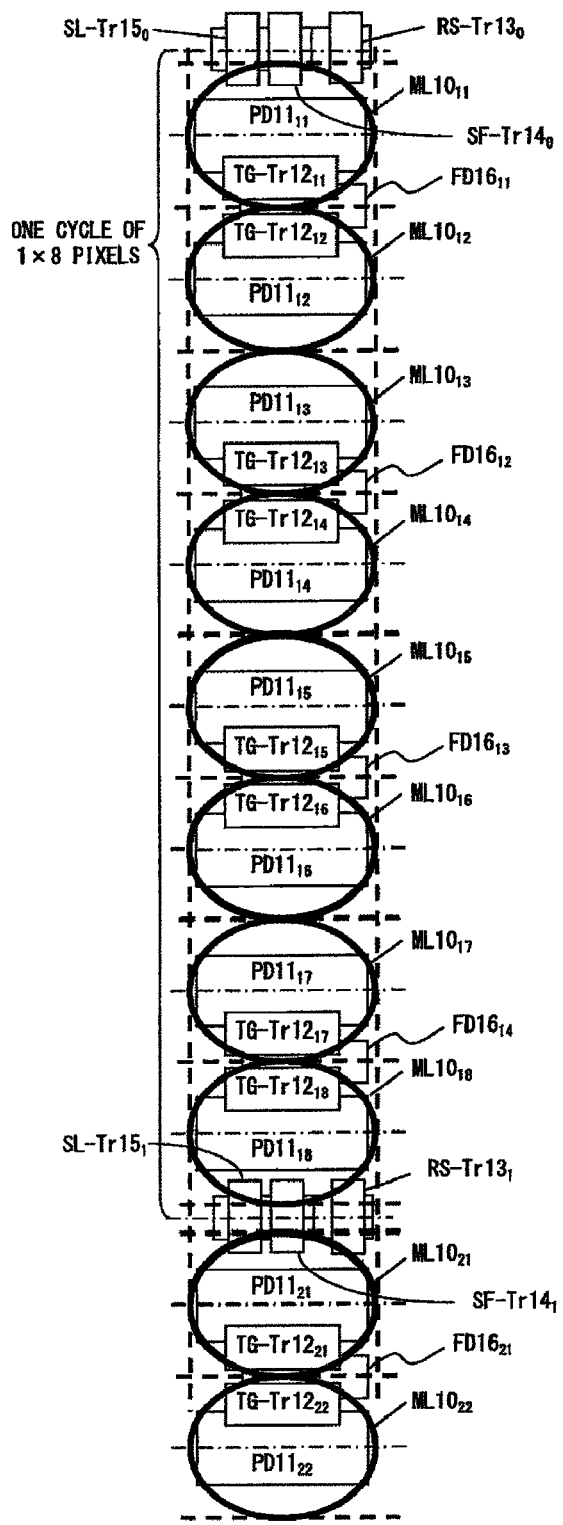
FIG. 10 explains the disposition of photo diodes and each transistor in the third preferred embodiment.

FIGS. 9 and 10 explain the third preferred embodiment. In the third preferred embodiment, transistors and the like are shared by every eight consecutive pixels as a unit in each row of pixels. As a result, only the interval between the last end of micro-lenses corresponding to the present eight consecutive pixels and the top end of micro-lenses corresponding to the next eight consecutive pixels is longer than that of the other micro-lenses.

In FIG. 10, as in FIG. 8 for the second preferred embodiment, three transistors, i.e., RS-$Tr13_1$, SF-$Tr14_1$ and SL-$Tr15_1$ are disposed between PD corresponding to each pixel at the end of every a consecutive of a plurality of pixels unit, for example, $PD11_{18}$ and $11_{21}$. As in FIG. 8, TG-$Tr12_{11}$ and $12_{12}$ and a floating diffusion layer $16_{11}$ corresponding to respective PD are disposed between the other PD, for example, $PD11_{11}$ and $11_{12}$.

FIGS. 11 and 12 explain the fourth preferred embodiment. In the fourth preferred embodiment, as shown in FIG. 11, micro-lenses are disposed in such a way that an interval between micro-lenses periodically may change every two pixels as a unit in each row on a pixel plane.

In FIG. 12, as in FIGS. 8 and 10 for the second and third preferred embodiments, respectively, three transistors, for example, RS-$Tr13_1$, SF-$Tr14_1$ and SL-$Tr15_1$ are disposed between PD corresponding to the each pixel at the end of every two consecutive pixels unit. As in FIGS. 8 and 10, two TG-$Tr12_{11}$ and $12_{12}$ and $FD16_1$ are disposed between photo diodes, for example, PD $11_{11}$ and $11_{12}$ which correspond to two consecutive pixels.

Figure 13:
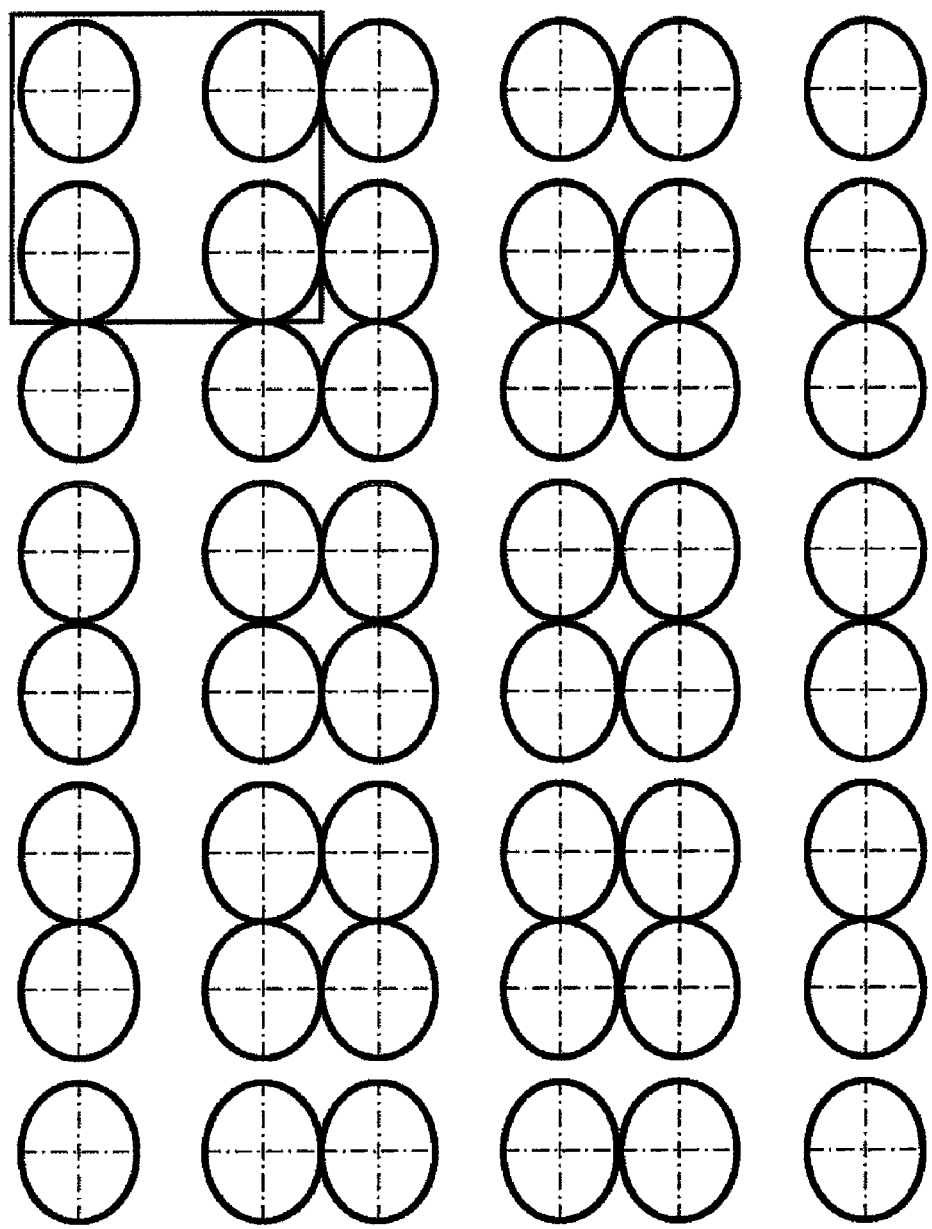
FIG. 13 explains the disposition method of micro-lens in the fifth preferred embodiment.
Figure 14:
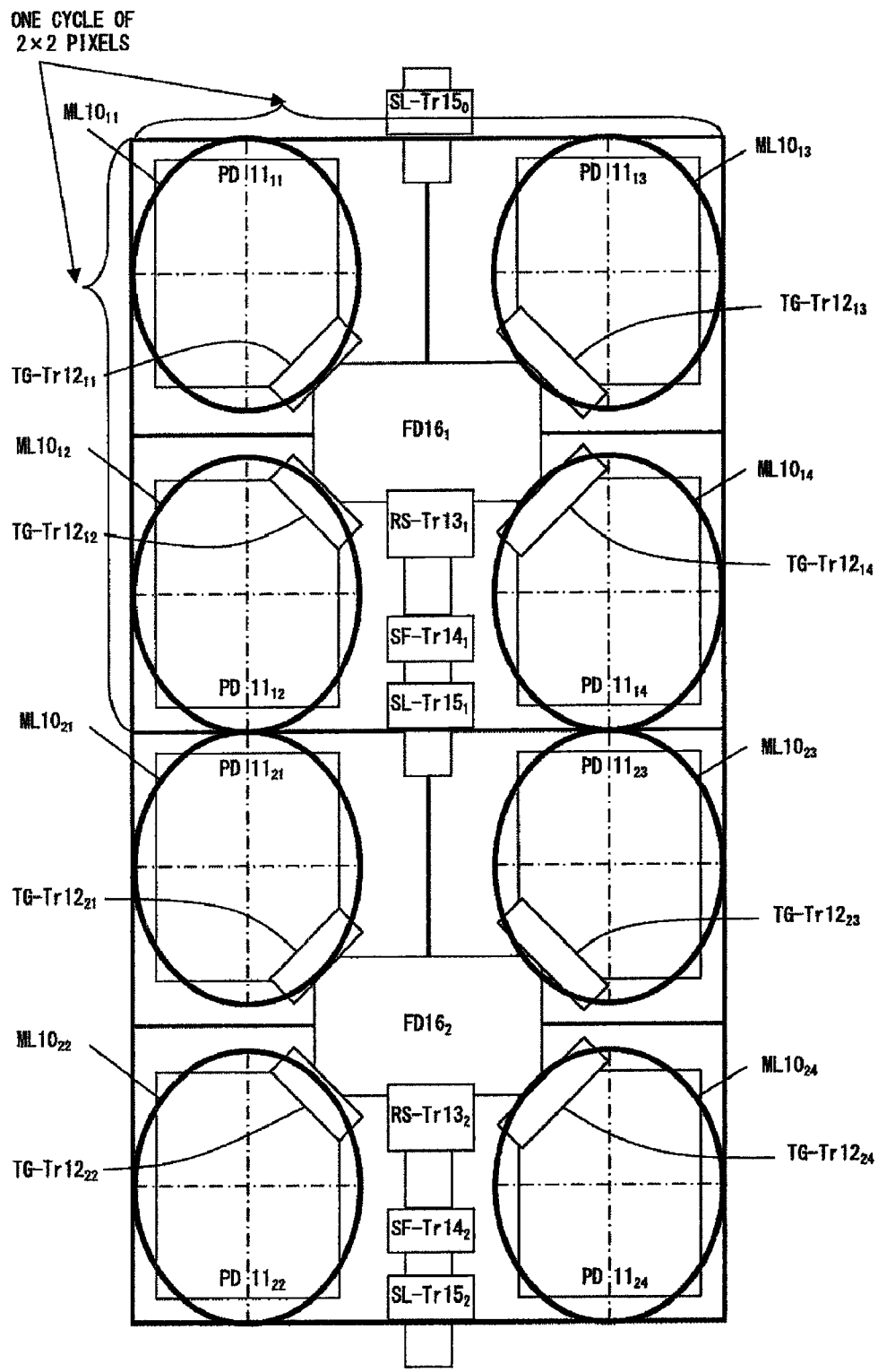
FIG. 14 explains the disposition of photo diodes and each transistor in the fifth preferred embodiment.

FIGS. 13 and 14 explain the fifth preferred embodiment. In the fifth preferred embodiment, as enclosed by a thin solid line in FIG. 13, micro-lenses are disposed in such a way that intervals between micro-lenses in the vertical and horizontal directions may periodically change every four pixels as a unit of two in the vertical direction, i.e., two pixels of row direction and horizontal direction, i.e., two pixels of column direction.

FIG. 14 explains the disposition of micro-lenses, photo diodes and transistors for pixel data read in the fifth preferred embodiment. In FIG. 14, the disposition of micro-lenses, for example, $ML10_{11}$~$ML10_{14}$, corresponding to four pixels is described. A floating diffusion layer $FD16_1$ shared by $PD11_{11}$~$PD11_{14}$ corresponding these four ML of $ML10_{11}$~$ML10_{14}$, respectively, are disposed at the center of an area corresponding to these four pixels and four TG of TG-$Tr12_{11}$-$12_{14}$ are disposed between each PD and the $FD16_1$.

Three transistors of RS-$Tr13_1$, SF-$TR14_1$ and $SLTr15_1$ are disposed between the $PD11_{12}$ and PD $11_{14}$ in FIG. 14. Thus, as shown in FIG. 13, of micro-lenses corresponding to four pixels, an interval between two micro-lenses in the horizontal direction is long and an interval between two micro-lenses in the vertical direction is comparatively short. And an interval between the micro-lens corresponding to each end pixel of the micro-lenses corresponding to adjacent four pieces unit of pixels in the vertical and horizontal directions is the shortest.

In the above-described preferred embodiment, an interval, that is, center pitch between micro-lenses is the shortest when two micro-lenses touch each other in the vertical and horizontal directions. However, if a somewhat minimum interval is necessary between two micro-lenses, micro-lenses can be also disposed in such a way as to secure the minimum interval.

As the detailed disposition example, the first up to fifth preferred embodiments are described above. Although in the description of these preferred embodiments, the center position of a photo diode corresponding to each pixel and that of a micro-lens is basically matched, in the latter half of the description of the preferred embodiments, the center position of a photo diode corresponding to each pixel and that of a micro-lens is deviated and disposed.

It is because if the center position of a photo diode corresponding to each pixel and that of a micro-lens is basically matched, the light collection efficiency of a pixel in the circumference of a pixel plane deteriorates since an incident light is generally applied to a pixel away from the center of the pixel plane on the pixel plane obliquely that the center position of a photo diode and that of a micro-lens is deviated.

Figure 15:
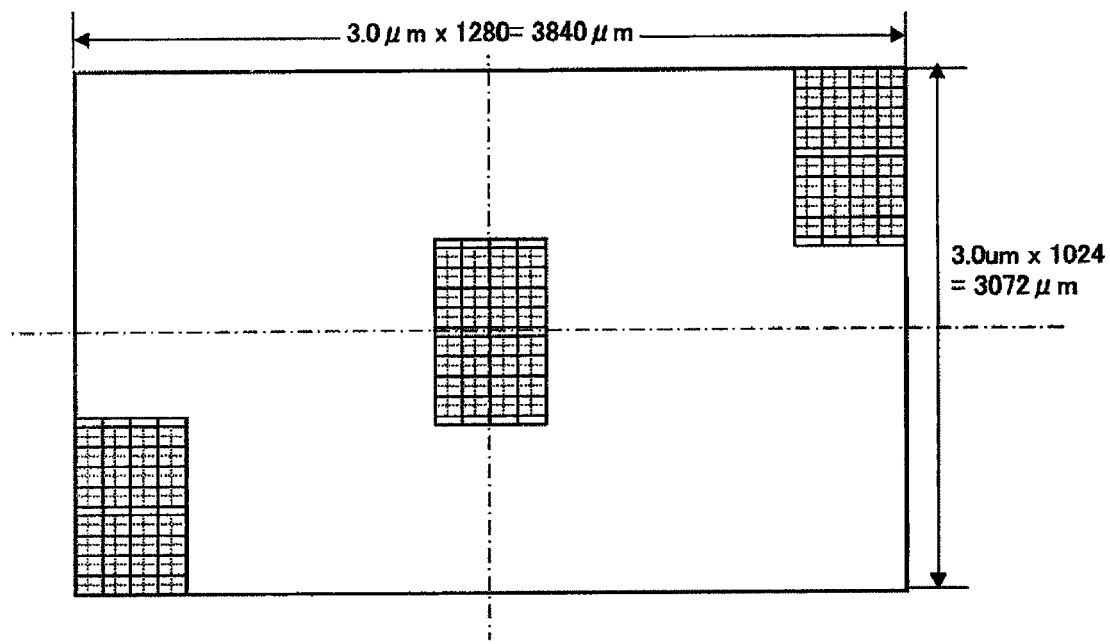
FIG. 15 shows an entire disposition of photo diodes on the pixel plane.

FIG. 15 shows the disposition of photo diodes on an entire of a pixel plane. In this preferred embodiment, in order to deviate the center position of a micro-lens from that of a photodiode in the circumference of a pixel plane, the disposition area (dimensions) is a little smaller than that of a photo diode corresponding to all the pixels. Thus, photo diodes and micro-lenses are disposed in such a way that although the center position of a photo diode and that of a micro-lens are almost the same at the center of the pixel plane, a little dimensional difference is integrated as away from the center and the deviation between the center position of a micro-lens from that of a photo diode becomes largest in the outer-circumference of the pixel plane.

In the photo diode disposition area shown in FIG. 15, it is assumed that the side length needed to dispose each photo diode is averaged every four pixels as a unit including a long interval to be 3.0 um in the vertical and horizontal directions. If the respective number of columns and rows on a pixel plane are 1280 and 1024, respectively, the respective side length in the horizontal and vertical directions needed to dispose photo diodes for the whole pixel plane are 3,840 um and 3,072 um, respectively. Although in FIG. 15, photo diodes are disposed only at the center, in the right top corner and the left bottom corner, actually photo diodes are disposed all over the pixel plane.

Figure 16:
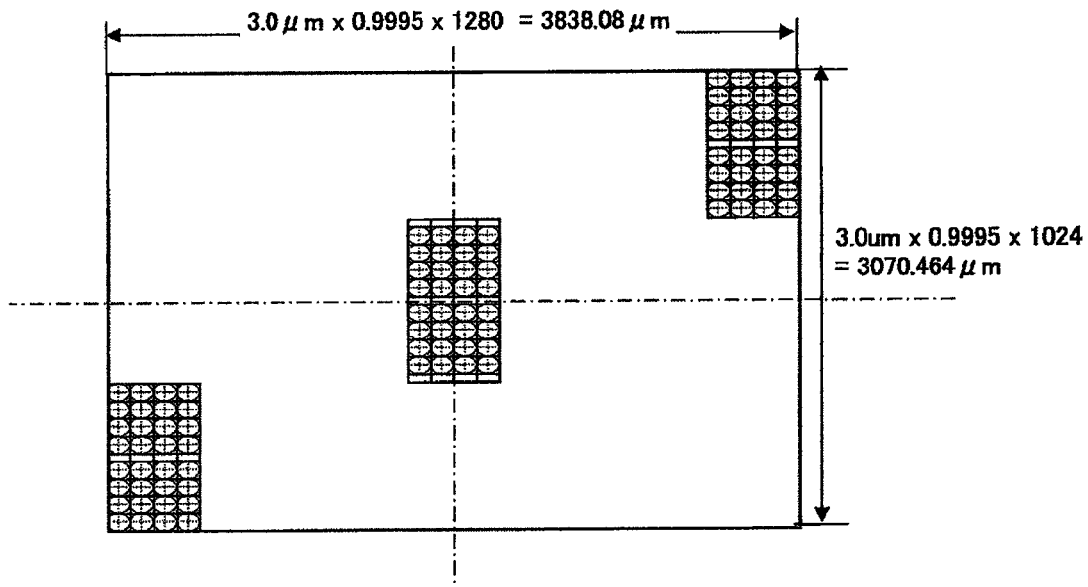
FIG. 16 shows an entire disposition of micro-lens on the pixel plane.

In FIG. 16, if the side length in the horizontal and vertical directions of each micro-lens disposition area is 99.95% of that of a photo diode area, the respective length in the horizontal and vertical directions needed to dispose all the micro-lenses become 3838.08 um and 3070.464 um, respectively, which is a little smaller than the photo diode disposition area shown in FIG. 15 although the unit is um. Thus, by matching the respective center positions of a photo diode with that of a micro-lens at the center of the pixel plane, the center position of a micro-lens and that of a photo diode can be deviated in the circumference of the pixel plane.

Figure 17:
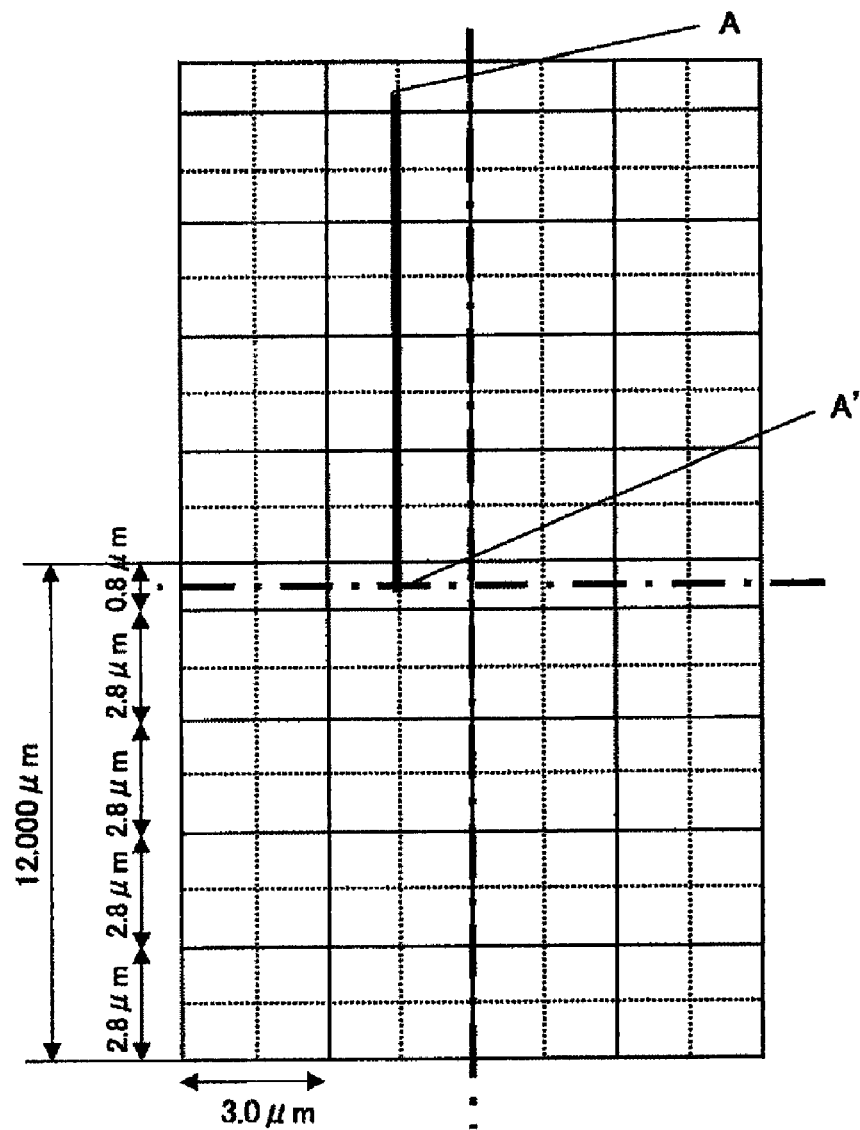
FIG. 17 explains the dimensions of a photo diode disposition area of on a pixel plane.

FIGS. 17 and 18 show the difference between a photo diode disposition area and a micro-lens disposition area. FIG. 17 shows the disposition of photo diodes. FIG. 17 shows the dimensions of a photo diode disposition area in the case where the interval, that is, center pitch, between photo diodes periodically changes every four consecutive pixels as a unit in each row direction, for example, as in FIG. 7 for the second preferred embodiment. The range with dimensions in FIG. 17 includes, for example, the disposition area of four PD corresponding to $ML10_{21}$~$ML10_{24}$ shown in FIG. 8 and a rectangular area between $ML10_{14}$ and $ML10_{21}$ corresponding to one of four pieces unit of pixels adjacent to these four pixels.

That is, FIG. 8 shows the length of the short diameter of an ellipse corresponding to $ML10_{21}$~$ML10_{24}$ and the height of the rectangular area between $ML10_{14}$ and $ML10_{21}$ are 2.8 um and 0.8 um, respectively. Then, each PD is disposed in such a way that its center may coincide with the center of the rectangular area with 3.0 um in horizontal and 2.8 um in vertical where it is disposed. The section A-A' as a line segment passing through the center of this PD is described with reference to FIG. 19.

FIG. 18 shows a micro-lens disposition area. FIG. 18 shows the dimensions of the disposition area of four consecutive micro-lenses in each column direction in relation with FIG. 17. Although in FIG. 18, for example, the length of 1 um is shorter than that shown in FIG. 17, there is no special meaning in it. The dimension of the disposition area of one micro-lens are 99.95% of horizontal and vertical dimensions, respectively, of the disposition area of a photo diode shown in FIG. 17, which is 2.9985 m in horizontal direction and 2.7986 um in vertical direction. The height of the rectangle between it and the disposition area of the next four consecutive micro-lenses is 0.7996 um that is 99.95% of the corresponding height of 0.8 um shown in FIG. 17. Naturally dimensions of long and short diameters of an ellipse as a base of the micro-lenses is actually less than these values.

Figure 19:
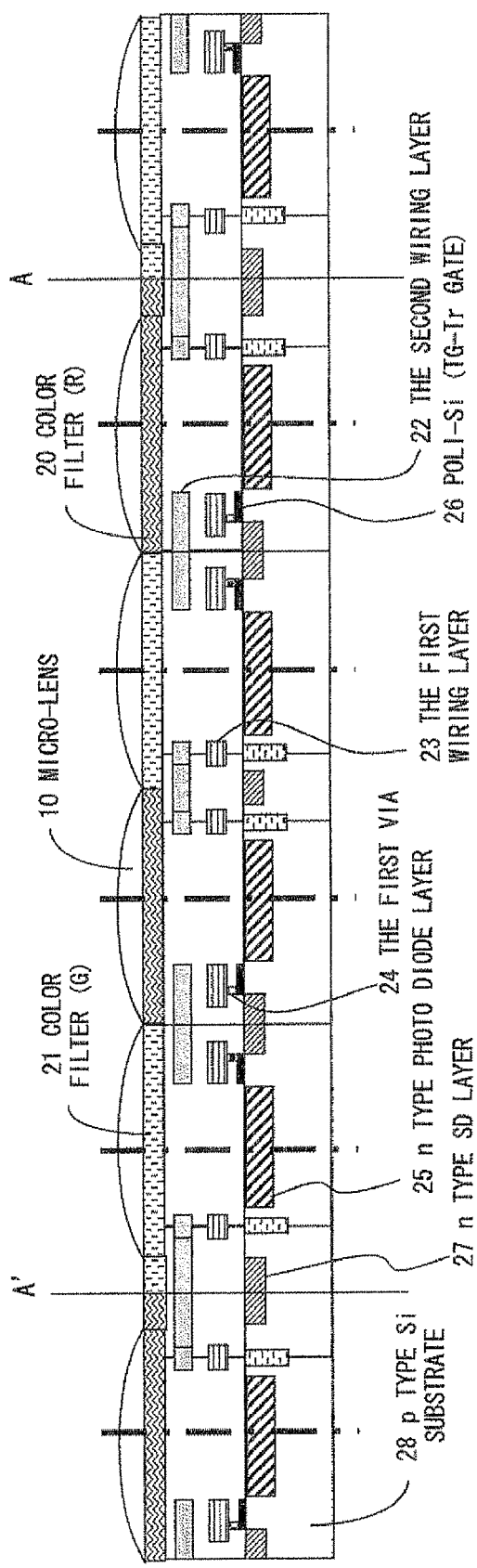
FIG. 19 is the cross section view of the solid state image sensing device around the center of a pixel plane.

FIG. 19 is the cross section view of a solid state image sensing device, corresponding to the line segment A-A' passing through the center of the photo diode and the center of the micro-lens shown in FIGS. 17 and 18, respectively. FIG. 19 shows the cross section in the case where this cross section near at the center of a pixel plane and the center position of a micro-lens and that of a photo diode are almost do not deviate.

In FIG. 19, color filters 20 and 21 are provided under each micro-lens 10 and further under it a photo diode, i.e., an n type photo diode layer 25 is provided in such a way that it center may almost coincide with the center of the micro-lens.

The color filter corresponds to any one color of R, G and B. For example, a color filter corresponding to a pixel in a specific position, the data of the pixel itself is used for R data for the position, which has not a direct related with this preferred embodiment. For example, for G data corresponding to a pixel having a color filter R is calculated by averaging or interpolating using the G data of a pixel, generally a plurality of pixels, having a color filter G around the position is calculated. Since each wiring layer, VIA and the like shown in FIG. 19 have no direct relation with this preferred embodiment, their descriptions are omitted. In FIG. 19, the first and second wiring layers do not cover the surface of the n type photo diode later 25 two-dimensionally. For example, the center of the photo diode described with reference FIG. 3 coincides with the surface center of the n type photo diode layer 25. However, if such a wiring layer or the like covers a part of the surface, it coincides with the center of its opening excluding the covered range.

Figure 20:
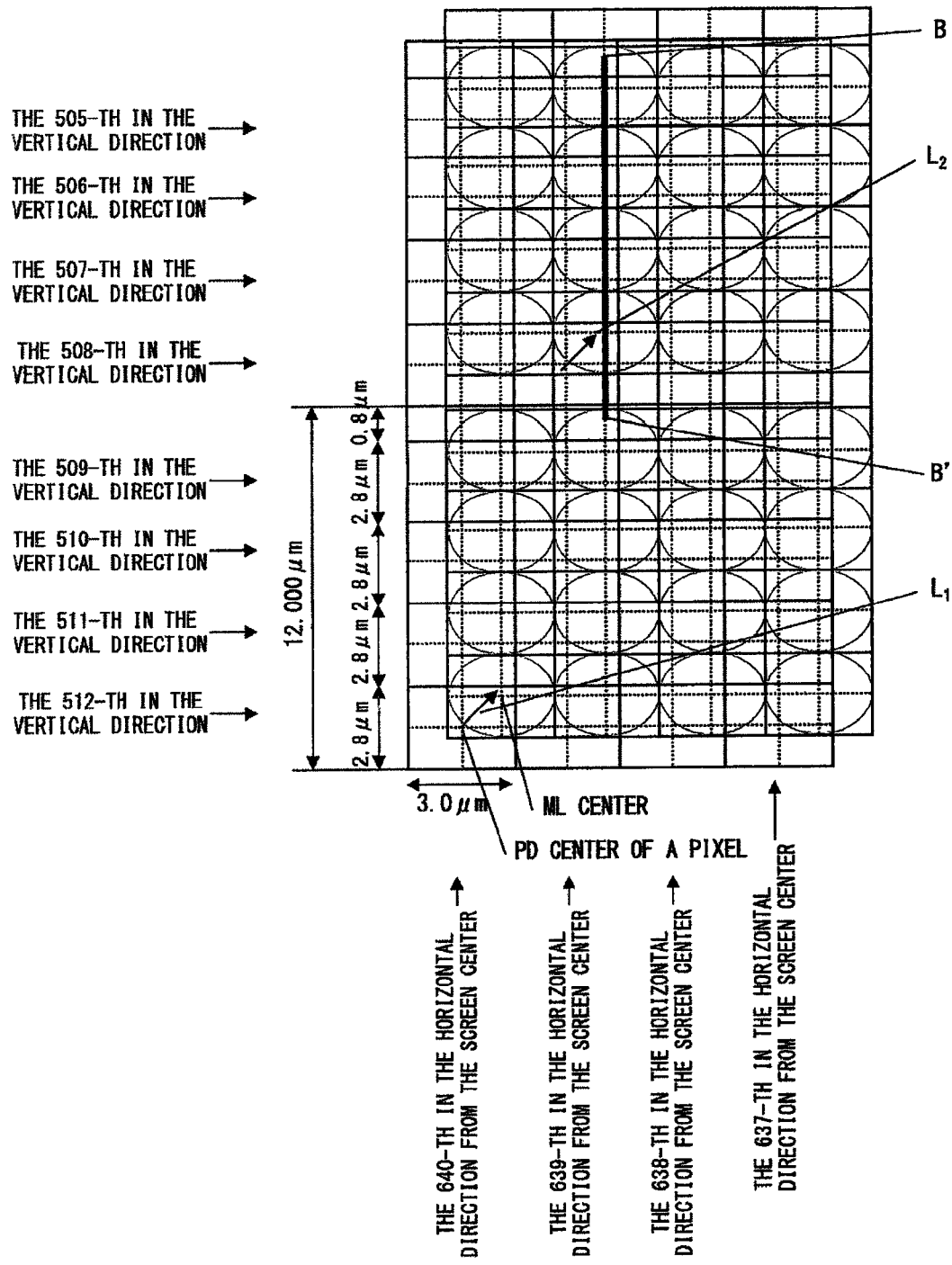
FIG. 20 explains the deviation between the center positions of a photo diode and a micro-lens in the left bottom corner of a pixel plane.

FIG. 20 explains the deviation between the center positions of a photo diode and a micro-lens, caused in the utmost outer circumference of a pixel plane when a photo diode and a micro-lens are disposed as shown in FIGS. 17 and 18, respectively. Although this deviation becomes a maximum in the four corners of the pixel plane, in FIG. 20, the deviation in the left bottom corner of the screen is described below.

Figure 21:
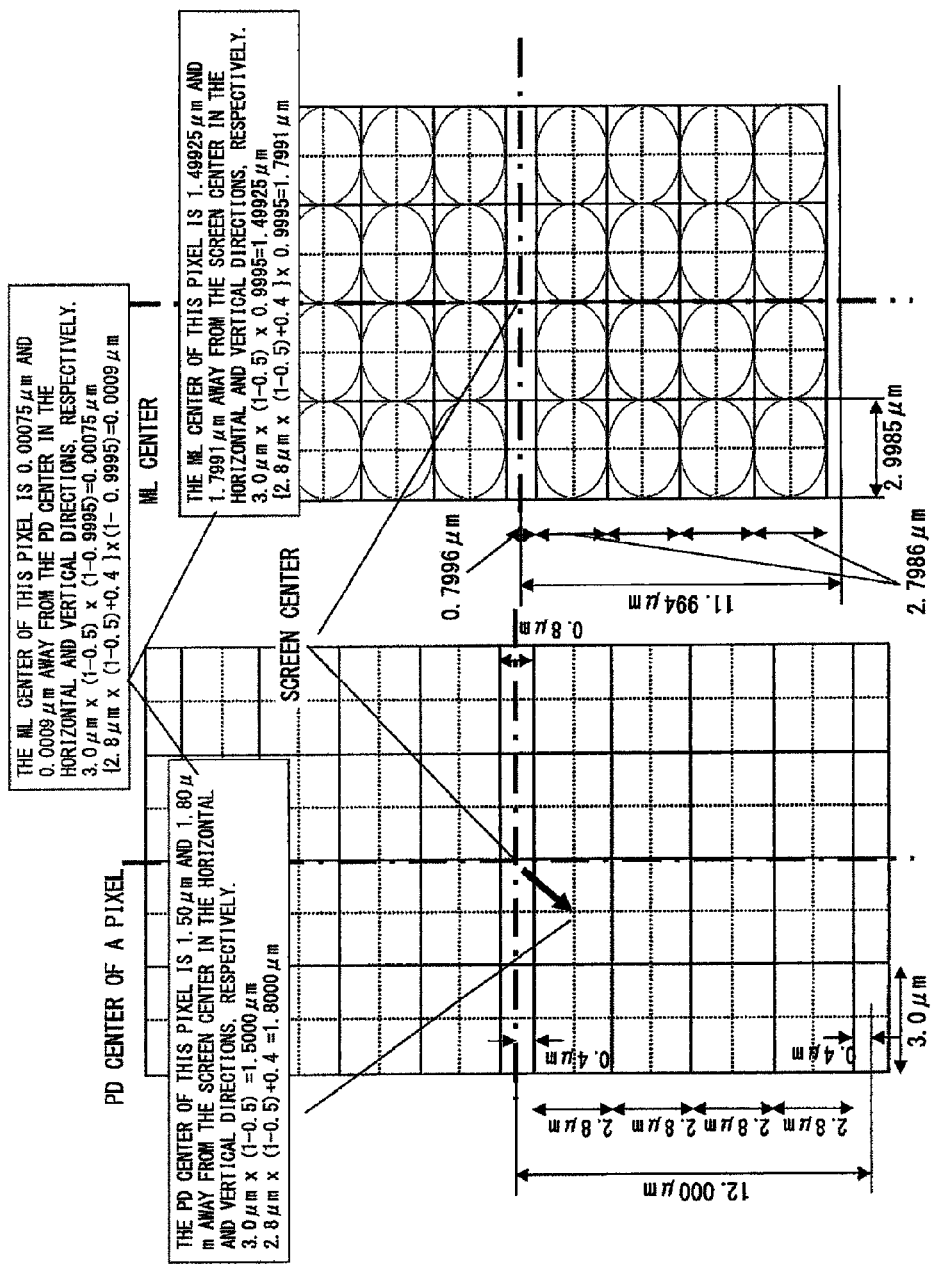
FIG. 21 explains the disposition dimensions of a photo diode and a micro-lens around the center of a pixel plane.

The deviation between the center positions of a photo diode and a micro-lens shown in FIG. 20 is further described with reference FIG. 21. FIG. 21 shows the disposition dimensions of a photo diode and a micro-lens around the center of the pixel plane (screen) instead of the corner. FIG. 21 shows the respective center positions of a photo diode and a micro-lens of the first pixel from the screen center in the lower left direction.

Since the horizontal dimensions of the disposition area of one pixel is 3.0 um as described with reference to FIG. 17, in the horizontal direction the center position of a photo diode on the left side is 1.5 um being the half of it away from the screen center. In the vertical direction, it is 1.8 um, which is obtained by adding the half of 2.8 um being the vertical dimensions of a pixel and the half of 0.8 um being the height of a rectangle as the disposition area of $SF-Tr14_1$ and $SL-Tr15_1$ shown in FIG. 5, away from the screen center.

In the disposition of micro-lenses on the right side, the center position of a micro-lens of the first pixel from the screen center in the lower left direction is away 99.95% of the distance between it and the center position of a photo diode from the screen center, that is 1.49925 um in the vertical direction and 1.7991 um in the horizontal direction away from the screen center, respectively.

Back to FIG. 20, firstly, the deviation in center position between a photo diode and a micro-lens of a pixel in the utmost left bottom corner, i.e., $L_1$ shown in FIG. 20 is described. As described with reference to FIGS. 15 and 16, the number of pixels in the horizontal direction of the pixel plane is 1,280. The present target pixel is the 640-th pixel in the left direction from the center of the pixel plane. Therefore, since the horizontal dimensions of a pixel is 3.0 um, the center position of a photo diode can be calculated by multiplying the number of pixel obtained by subtracting ½ from the number of pixels of 640 by 3.0 um. The horizontal distance between the center of this photo diode and that of a micro-lens can be calculated as follows.

$$3.0 \times (1280/2 - 0.5) \times (1 - 0.9995) = 0.95925 (um)$$

Since the number of pixels in the vertical direction of the pixel plane is 1,024, a target pixel in the vertical direction is the 512-th pixel from the screen center. In order to calculate the center position (vertical direction) of the photo diode of this pixel, a distance between the screen center and one previous period in periods which use four pixels including the target pixel as a unit, i.e., an area which uses four pixels as a unit up to the 508-th pixel from the screen center, i.e., a distance until immediately before the disposition area of the 509-th pixel is considered. The distance can be obtained by dividing 508 being the number of pixels up to immediately before it by four as a unit of period, multiplying the result by 12 um being the vertical dimensions of the disposition area of four pixels, including a rectangle as the disposition area of, for example, SF-Tr$14_1$ and SL-Tr$15_1$ shown in FIG. 5, and adding the result with the half of the height of the rectangle horizontally running toward the screen center as described in FIG. 21. As a result, the distance from the screen center of a photo diode corresponding to a target pixel can be obtained by adding a product obtained by multiplying 2.8 um being the vertical dimensions of 3.5 pixels to this result. Thus, the horizontal deviation in center position between a photodiode and a micro-lens can be obtained as follows.

{(508/4×12)+0.8/2+(3.5×2.8)}×(1−0.9995)=0.7671 (um)

Then, the deviation in center position between a photo diode and a micro-lens corresponding to a pixel which is the second in the right direction and the fifth in the upper direction from the left bottom corner of a screen in FIG. 20, i.e., the pixel number of 639-th in the horizontal direction and pixel number of 508-th in the vertical direction, i.e., the horizontal direction factor corresponding to L2 shown in FIG. 20 can be calculated as follows.

3.0×{(1,280/2)−1.5}×(1−0.9995)=0.95775(um)

Also, the vertical factor can be calculated as follows.

{(504/4×12)+0.8/2+(3.5×2.8)}×(1−0.9995)=0.7611 (um)

In this case, as to the horizontal direction the fact that it is the second from the left end of the screen is considered by the "1.5" in the equation, and the vertical direction is calculated based on the distance up to the storage area (including the disposition areas of SF-Tr and SL-Tr) of the 504$^{th}$ pixel from the screen center.

In FIG. 20, although the length of each of $L_1$ and $L_2$ as actual deviations can be calculated according to Pythagorean theorem, $L_2$ is naturally a little smaller than $L_1$. Therefore, the further it is away from the center of the pixel center, the larger the deviation in center deviation between a micro-lens and a photo diode, corresponding to the pixel becomes. Thus, the light collection efficiency of incident light by a micro-lens can be improved in relation with a general tendency that although light enters almost vertically against the pixel plane around the center of the pixel plane, it enters obliquely in the circumference of the pixel plane.

Figure 22:
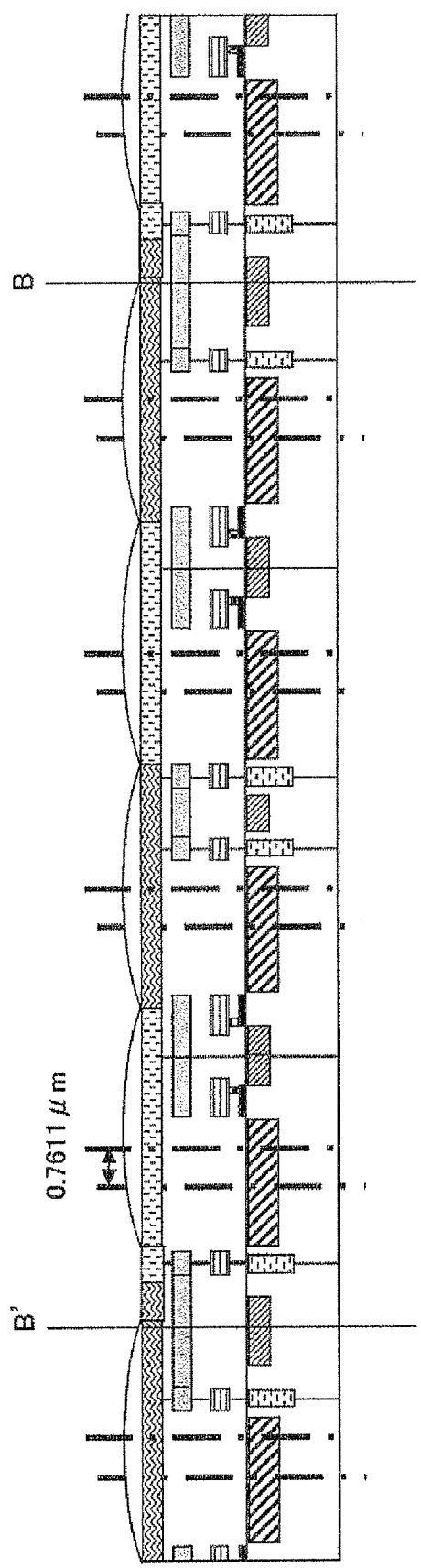
FIG. 22 explains the cross section view of a solid state image sensing device in the circumference of the pixel plane.

FIG. 22 is the cross section view of a solid state image sensing device in the line segment B-B' near the left bottom corner of the screen in FIG. 20. FIG. 22 shows that the vertical deviation in center position between a micro-lens and a photo diode corresponding to a pixel which is the second on the right side and the fifth on the upper side from the left bottom corner of the screen is 0.7611 um. As described above, this amount of deviation increases as the pixel goes away from the center of the screen. The dimensions of a pixel used in the above-described calculation are one applicable, for example, in a CMOC image sensor.

Although the preferred embodiments have been so far described in detail, the present embodiments are not limited to those and further various preferred embodiments can be possible as described in "What is claimed is:".

For example, the number of pixels as the unit of the periodical change of the center pitch of a photo diode or a micro-lens is not limited to the above. An arbitrary number can be used for the number of pixels in the vertical and horizontal directions and the unit of the periodical change of the center pitch using the number of pixels in the vertical and horizontal directions.

Although in the above-described description, the shape of the base of a micro-lens is an ellipse, it corresponds to a shape obtained by pressing the round base of a photo diode whose center interval is uniform in the vertical direction in accordance with the center interval of a photo diode as described with reference to FIG. 3. The base shape of a micro-lens can be naturally a circle in the manufacturing process of a solid state image sensing device.

Although in the above-described description, a CMOS image sensor is used for the image sensing device, a MOS image sensing device, a junction FET image sensing device, a sensing device using a bi-polar transistor, CCD and the like can be also used as long as a light receiving device, such as a photo diode, etc. and devices, such as transistors, etc., are periodically disposed across a plurality of pixels in it.

What is claimed is:

1. A solid state image sensing device in which a plurality of pixels are disposed in a matrix on a two-dimensional plane and transistors are shared to read pixel data from a light receiving device in each of the plurality of pixels, comprising:
    a plurality of light receiving devices disposed with different pitches in at least one of a column direction and a row direction; and
    a plurality of micro-lenses which are used to collect incident light of each of the plurality of light receiving devices and are disposed with different pitches in accordance with positions of the light receiving devices, wherein
    a center pitch of each of the light receiving devices and micro-lenses changes by a periodic of every consecutive four pieces of pixels in a row direction,
    each of the consecutive four pieces of pixels in a row direction includes a light receiving device and a first transistor to transfer a charge signal outputted from the light receiving device,
    each of a consecutive two pieces of pixels among the consecutive four pieces of pixels shares a signal voltage conversion unit to convert the charge signal, which is outputted from the light receiving device and are transferred by the first transistor, to a voltage,
    the consecutive four pieces of pixels shares a signal voltage read unit comprising a second transistor capable of resetting voltage of the signal voltage conversion unit, a third transistor to amplify a voltage outputted from the signal voltage conversion unit as input, and a fourth transistor to select a row to which a pixel belongs and to output the amplified voltage to an exterior,
    the light receiving device/the signal voltage conversion unit and two of the first transistor/the light receiving device/the third transistor and the fourth transistor/the light receiving device/the signal voltage conversion unit and two of the first transistor/the light receiving device/the second transistor are disposed in that order, and
    a center pitch length between two light receiving devices between which the third transistor and the fourth transistor are inserted and a center pitch length between micro-lenses corresponding to the two light receiving devices between which the third transistor and the fourth transistor are inserted are longer than a center pitch length between two light receiving devices between which the third transistor and the fourth transistor are not inserted and a center pitch length between micro-lenses corresponding to the two light receiving devices between which the third transistor and the fourth transistor are not inserted, respectively.

2. The solid state image sensing device according to claim 1, wherein
    a center position on each of the light receiving devices on the two-dimensional plane and a center position of each of the plurality of micro-lenses disposed on a plane in parallel with said two-dimensional plane are two-dimensionally matched.

3. The solid state image sensing device according to claim 2, wherein
the light receiving device is a photo diode, and
the center of the light receiving device coincides with a center of a surface of a diffusion layer forming the photo diode.

4. The solid state image sensing device according to claim 2, wherein
the light receiving device is a photo diode, and
the center of the light receiving device coincides with a center of an opening excluding a range covered by a wiring layer, of a diffusion layer forming the photo diode.

5. The solid state image sensing device according to claim 1, wherein
a center pitch of micro-lenses that are started being disposed in a left right of a column direction and in an up down of a row direction of a pixel plane from a position corresponding to a center of a screen on which an image is sensed by the solid state image sensing device, is a constant times of a center pitch of corresponding disposed light receiving devices.

6. The solid state image sensing device according to claim 5, wherein
a value of the constant times is less than 1.

7. The solid state image sensing device according to claim 1, wherein
dimensions of bases of the plurality of micro-lenses are the same.

8. The solid state image sensing device according to claim 7, wherein
a shape of a base of the micro-lens is an ellipse.

9. The solid state image sensing device according to claim 1, wherein
a color filter is provided between the micro-lens and the light receiving device.

10. The solid state image sensing device according to claim 1, further comprising:
a first area in which the plurality of light receiving devices are disposed at a first pitch; and
a second area in which the light receiving devices are disposed at a second pitch longer than the first pitch,
wherein the first area and the second area are disposed alternately.

11. A solid state image sensing device in which a plurality of pixels are disposed in a matrix on a two-dimensional plane and transistors are shared to read pixel data from a light receiving device in each of the plurality of pixels, comprising:
a plurality of light receiving devices disposed with different pitches in at least one of a column direction and a row direction; and
a plurality of micro-lenses which are used to collect incident light of each of the plurality of light receiving devices and are disposed with different pitches in accordance with positions of the light receiving devices, wherein
a center pitch of each of the light receiving devices and micro-lenses changes by a periodic of every consecutive four pieces of pixels in a row direction,
each of the consecutive four pieces of pixels in a row direction comprises
the light receiving device; and
a first transistor to transfer a charge signal outputted from the light receiving device,
each of a consecutive two pieces of pixels among the consecutive four pieces of pixels shares a signal voltage conversion unit to convert a charge signal, which is outputted from the light receiving device and are transferred by the first transistor, to a voltage,
the consecutive four pieces of pixels shares a signal voltage read unit comprising a second transistor capable of resetting voltage of the signal voltage conversion unit, a third transistor to amplify voltage outputted by the signal voltage conversion unit, and a fourth transistor to select a column to which a pixel belongs,
the light receiving device/the signal voltage conversion unit and two of the first transistor/the light receiving device/the second transistor, the third transistor and the fourth transistor/the light receiving device/the signal voltage conversion unit and two of the first transistor/the light receiving device are disposed in that order, and
a center pitch length between two light receiving devices between which the second transistor, the third transistor and the fourth transistor are inserted and a center pitch length between micro-lenses corresponding to the two light receiving devices between which the second transistor, the third transistor and the fourth transistor are inserted are longer than a center pitch length between two light receiving devices between which the second transistor, the third transistor, and the fourth transistor are not inserted and a center pitch length between micro-lenses corresponding to the two light receiving devices between which the second transistor, the third transistor, and the fourth transistor are not inserted, respectively.

12. The solid state image sensing device according to claim 11, wherein
a center position on each of the light receiving devices on the two-dimensional plane and a center position of each of the plurality of micro-lenses disposed on a plane in parallel with said two-dimensional plane are two-dimensionally matched.

13. The solid state image sensing device according to claim 12, wherein
the light receiving device is a photo diode, and
the center of the light receiving device coincides with a center of a surface of a diffusion layer forming the photo diode.

14. The solid state image sensing device according to claim 12, wherein
the light receiving device is a photo diode, and
the center of the light receiving device coincides with a center of an opening excluding a range covered by a wiring layer, of a diffusion layer forming the photo diode.

15. The solid state image sensing device according to claim 11, wherein
a center pitch of micro-lenses that are started being disposed in a left right of a column direction and in an up down of a row direction of a pixel plane from a position corresponding to a center of a screen on which an image is sensed by the solid state image sensing device, is a constant times of a center pitch of corresponding disposed light receiving devices.

16. The solid state image sensing device according to claim 11, wherein
dimensions of bases of the plurality of micro-lenses are the same.

17. The solid state image sensing device according to claim 11, wherein
a color filter is provided between the micro-lens and the light receiving device.

18. The solid state image sensing device according to claim 11, further comprising:
a first area in which the plurality of light receiving devices are disposed at a first pitch; and
a second area in which the light receiving devices are disposed at a second pitch longer than the first pitch,
wherein the first area and the second area are disposed alternately.

* * * * *